United States Patent
Zhuang et al.

(10) Patent No.: US 6,669,870 B2
(45) Date of Patent: Dec. 30, 2003

(54) SUBSTITUTED PHENYLETHYLENE PRECURSOR SYNTHESIS METHOD

(75) Inventors: Wei-Wei Zhuang, Vancouver, WA (US); Tue Nguyen, Vancouver, WA (US); Lawrence J. Charneski, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 400 days.

(21) Appl. No.: 09/820,024

(22) Filed: Mar. 28, 2001

(65) Prior Publication Data

US 2001/0009274 A1 Jul. 26, 2001

Related U.S. Application Data

(62) Division of application No. 09/210,099, filed on Dec. 11, 1998, now Pat. No. 6,245,261.

(51) Int. Cl.[7] .............................. H01B 1/02; H01B 1/00
(52) U.S. Cl. .................... 252/519.2; 250/500; 427/253; 260/430
(58) Field of Search ............................. 252/519.2, 500; 427/253; 260/430

(56) References Cited

U.S. PATENT DOCUMENTS

| | | | | | |
|---|---|---|---|---|---|
| 4,385,005 | A | * | 5/1983 | Doyle | 260/464 |
| 4,425,281 | A | * | 1/1984 | Doyle | 260/430 |
| 5,028,724 | A | * | 7/1991 | Ivankovits et al. | 556/40 |
| 5,085,731 | A | * | 2/1992 | Norman et al. | 156/646 |
| 5,098,516 | A | * | 3/1992 | Norman et al. | 156/666 |

* cited by examiner

*Primary Examiner*—Yogendra N. Gupta
*Assistant Examiner*—Derrick G. Hamlin
(74) *Attorney, Agent, or Firm*—David C. Ripma; Matthew D. Rabdau; Scott C. Krieger

(57) ABSTRACT

A Cu(hfac) precursor with a substituted phenylethylene ligand has been provided. The substituted phenylethylene ligand includes bonds to molecules selected from the group consisting of $C_1$ to $C_6$ alkyl, $C_1$ to $C_6$ haloalkyl, $C_1$ to $C_6$ phenyl, H and $C_1$ to $C_6$ alkoxyl. One variation, the α-methylstyrene ligand precursor has proved to be stable a low temperatures, and sufficiently volatile at higher temperatures. Copper deposited with this precursor has low resistivity and high adhesive characteristics. A synthesis method has been provided which produces a high yield of the above-described precursor.

2 Claims, 3 Drawing Sheets

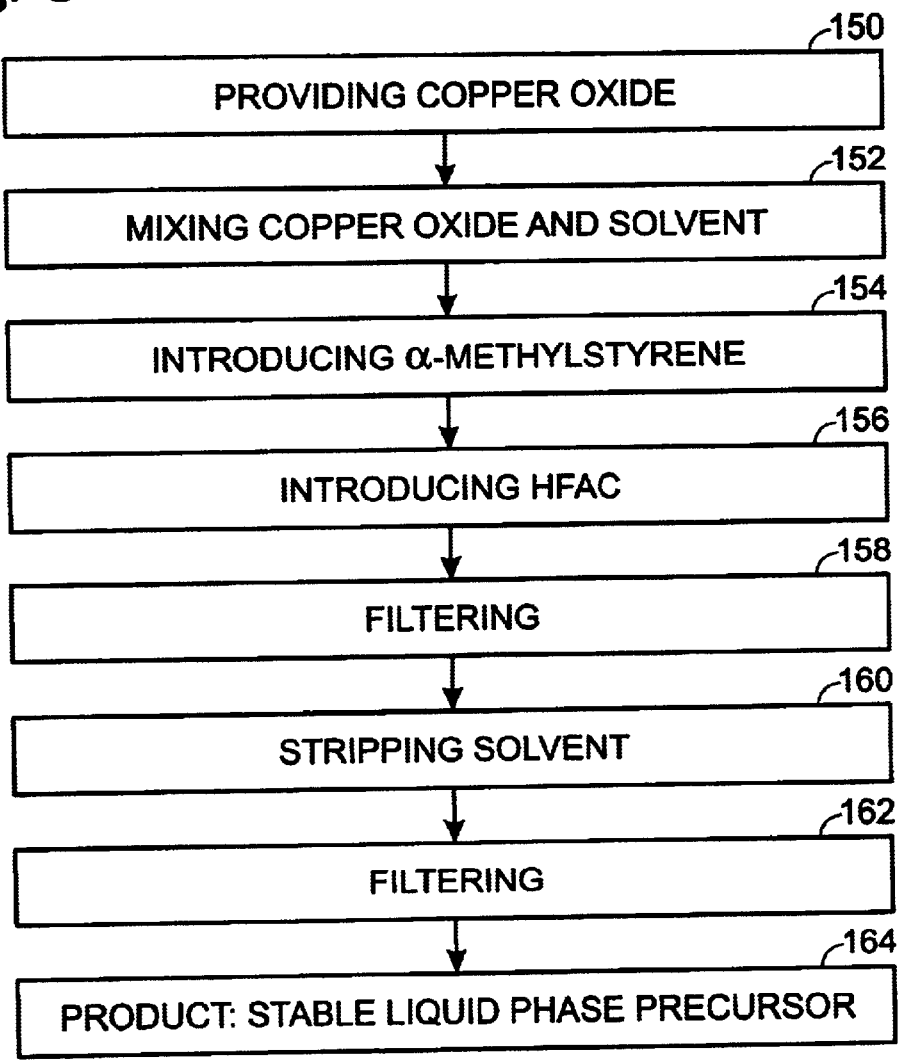

SUBSTITUTED PHENYLETHYLENE PRECURSOR SYNTHESIS METHOD

This application is a divisional of application Ser. No. 09/210,099, filed Dec. 11, 1998, entitled "Substituted Phenylethylene Precursor and Synthesis Method," now U.S. Letters Patent No. 6,245,261.

BACKGROUND AND SUMMARY OF THE INVENTION

This invention claims the benefit of a provisional application Ser. No. 60/107892, filed Nov. 10, 1998, entitled "Improved Copper Precursor and Synthesis Method", having the same inventors as the present application.

This invention relates generally to integrated circuit processes and fabrication, and more particularly, to a precursor and synthesis method, having a substituted phenylethylene ligand, such as α-methylstyrene, which improves liquid phase stability, and which is capable of depositing copper at high deposition rates, low resistivity, and with good adhesion on selected integrated circuit surfaces.

The demand for progressively smaller, less expensive, and more powerful electronic products, in turn, fuels the need for smaller geometry integrated circuits (ICs) on larger substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the area of the interconnecting surfaces is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand process environments of volatile ingredients. Aluminum and tungsten metals are often used in the production of integrated circuits for making interconnections or vias between electrically active areas. These metals are popular because they are easy to use in a production environment, unlike copper which requires special handling.

Copper (Cu) would appear to be a natural choice to replace aluminum in the effort to reduce the size of lines and vias in an electrical circuit. The conductivity of copper is approximately twice that of aluminum and over three times that of tungsten. As a result, the same current can be carried through a copper line having nearly half the width of an aluminum line.

The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore barriers are typically erected to prevent copper from migrating. Elements of copper migrating into these semiconductor regions can dramatically alter the conduction characteristics of associated transistors. Another problem with the use of copper is the relatively high temperature needed to deposit it on, or removing it from, an IC surface. These high temperatures can damage associated IC structures and photoresist masks.

It is also a problem to deposit copper onto a substrate, or in a via hole, using the conventional processes for the deposition of aluminum when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, first, a physical vapor deposition (PVD), and then, a chemical vapor deposition (CVD) technique, have been developed by the industry.

With the PVD technique, an IC surface is exposed to a copper vapor, and copper is caused to condense on the surfaces. The technique is not selective with regard to surfaces. When copper is to be deposited on a metallic surface, adjoining non-conductive surfaces must either be masked or etched clean in a subsequent process step. As mentioned earlier, photoresist masks and some other adjoining IC structures are potentially damaged at the high temperatures at which copper is processed. The CVD technique is an improvement over PVD because it is more selective as to which surfaces copper is deposited on. The CVD technique is selective because it is designed to rely on a chemical reaction between the metallic surface and the copper vapor to cause the deposition of copper on the metallic surface.

In a typical CVD process, copper is combined with a ligand, or organic compound, to help insure that the copper compound becomes volatile, and eventually decomposes, at consistent temperatures. That is, copper becomes an element in a compound that is vaporized into a gas, and later deposited as a solid when the gas decomposes. Selected surfaces of an integrated circuit, such as diffusion barrier material, are exposed to the copper gas, or precursor, in an elevated temperature environment. When the copper gas compound decomposes, copper is left behind on the selected surface. Several copper gas compounds are available for use with the CVD process. It is generally accepted that the configuration of the copper gas compound, at least partially, affects the ability of the copper to be deposited on to the selected surface.

Copper metal thin films have been prepared via chemical vapor deposition by using many different kinds of copper precursors. In 1990, D. B. Beach et al. Chem. Mater. (2) 216 (1990) obtained pure copper films via CVD by using ($\eta^5$-$C_5H_5$)Cu(PMe$_3$), and later, in 1992, H. K. Shin et al., Chem. Mater. (4) 788 (1992) declared the same results by using (hfac)Cu(PR$_3$)$_n$ (R=methyl and ethyl and $\eta$=1 and 2). However, these copper precursors are solids, which can not be used in the liquid delivery system for copper thin film CVD processing. Furthermore, the copper films often contain contamination of carbon and phosphorus, which can not be used as interconnectors in microprocessors.

$Cu^{2+}$(hfac)$_2$, or copper (II) hexafluoroacetylacetonate, precursors have previously been used to apply CVD copper to IC substrates and surfaces. However, these $Cu^{2+}$ precursors are notable for leaving contaminates in the deposited copper, and for the relatively high temperatures that must be used to decompose the precursor into copper.

The studies of copper precursors conducted in the early of 1990's were concentrated on the evaluation of a series of copper(I) fluorinated β-diketonate complexes, which have been proven to be very promising sources for the use in the chemical vapor deposition of copper metal thin films. Copper(I) fluorinated β-diketonate complexes were first synthesized by Gerald Doyle, U.S. Pat. Nos. 4,385,005 (1983) and 4,425,281 (1984), in which he presented the synthesis method and their application in the separation of unsaturated organic hydrocarbons. In the U.S. Pat. No. 5,096,737 (1992), Thomas H. Baum, et at., claimed the application of these copper(I) fluorinated β-diketonate complexes as copper precursors for CVD copper thin film preparation. Copper thin films have been prepared via chemical vapor deposition using these precursors.

Among several liquid copper precursors, 1,5-dimethyl 1,5-cyclooctadiene copper(I) hexafluoroacetylacetonate mixed with 1,6-dimethyl 1,5-cyclooctadiene copper(I) hexafluoroacetylacetonate ((DMCOD)Cu(hfac)) and hexyne copper(I) hexafluoroacetylacetonate ((HYN)Cu(hfac) were evaluated in detail. The copper thin films deposited using (DMCOD)Cu(hfac) have very good adhesion to metal or metal nitride substrates, but a high resistivity (2.5 $\mu\Omega\cdot cm$) and a low deposition rate. (HYN)Cu(hfac) copper film has poor adhesion to a TiN substrate, and high resistivity (~2.1 $\mu\Omega\cdot cm$). Another compound, butyne copper(I)(hfac), ((BUY)Cu(hfac)), gives a copper film with low resistivity (1.93 $\mu\Omega cm$), but has poor adhesion and is relatively expensive. Also, the compound is a solid and, therefore, difficult to use in a liquid delivery system. The invention of copper (I)(hfac) stabilized with a series of trialkylvinylsilane (John A. T. Norman et al., U.S. Pat. No. 5,085,731 (1992)) improved the properties of copper thin films.

Copper films deposited using a liquid copper precursor, (hfac)Cu(TMVS), where TMVS=trimethylvinylsilane, have low resistivities and reasonably adhesion to substrates. This precursor is useful because it can be used at relatively low temperatures, approximately 200° C. This liquid copper precursor has been used for the preparation of copper metal thin films via CVD for some time, but there are still some drawbacks: stability, the adhesion of copper films, and cost for the trimethylvinylsilane stabilizer. Also, the precursor is not especially stable, and can have a relatively short shelf life if not refrigerated. Various ingredients have been added to (hfac)Cu(tmvs) to improve its adhesiveness, temperature stability, and the rate at which it can be deposited on an IC surface. U.S. Pat. No. 5,744,192, entitled "Method Of Using Water To Increase The Conductivity Of Copper Deposited With Cu(HFAC)TMVS", invented by Nguyen et al., discloses a precursor and method of improving the electrical conductivity of Cu deposited with (hfac)Cu(tmvs).

It is generally acknowledged in the industry that (hfac) Cu(tmvs) becomes unstable, and begins to decompose, above 35° C. Use of a (hfac)Cu(tmvs) precursor stored at this temperature leads to undesirable process results. The effectivity of (hfac)Cu(tmvs) stored at temperatures lower than 35° C. is also unpredictable. A "fresh" batch of precursor, or precursor stored at temperatures well below room temperature, is used to guarantee predictable processes.

A Cu precursor comprising a ligand of methoxy and methyl groups is disclosed in co-pending application Ser. No. 08/779,640, filed Jan. 7, 1997, entitled "Precursor with (Methoxy)(methyl)silylolefin Ligands to Deposit Cu and Method for Same", invented by Senzaki et al., and assigned to the same assignee as the instant patent. The disclosed precursor permits either one or two methoxy groups to be bonded to the silicon atom of the ligand. That is, the precursor can be "fine tuned" using ligands having more methoxy groups than tmvs, but less than tmovs are provided. The oxygen atoms in the methoxy groups contribute electrons to the Cu atoms, to strengthen the Cu-olefin bond, and so, prevent the premature decomposition of the precursor in storage, or as the precursor is heated for the application of Cu to an IC surface. However, only hydrocarbon groups of one carbon atom, $CH_3$ (methyl) and $OCH_3$ (methoxy), are disclosed.

A Cu precursor comprising a ligand of alkyl and alkyl groups is disclosed in U.S. Pat. No. 5,767,301, entitled "Precursor with (Alkyloxy)(Alkyl)silylolefin Ligands to Deposit Copper", invented by Senzaki et al. The disclosed precursor describes alkyl groups bonded to the silicon atom of the ligand with alkoxyl groups. However, the search continues for even more effective copper precursors.

It would be advantageous if a copper precursor was found that effectively deposits copper with low resistivity and good adhesion properties. It would be further advantageous if this precursor was inexpensive to synthesize.

It would be advantageous if a method were found of making a Cu(hfac) precursor stable over a wider range of temperatures, and to provide that the precursor remain in liquid phase during storage.

It would also be advantageous if water, H-hfac, H-hfac dihydrate (H-hfac·$2H_2O$) were no longer necessary to blend with a Cu precursor to improve the thermal stability of the Cu precursor.

Accordingly, a volatile copper (Cu) precursor compound for the chemical vapor deposition (CVD) of copper (Cu) to selected surfaces is provided. The precursor compound comprises:

$Cu^{+1}$(hexafluoroacetylacetonate); and a substituted phenylethylene ligand including one phenyl group bonded to a first carbon atom, with the remaining bond to said first carbon atom being selected from a first group consisting of $C_1$ to $C_6$ alkyl, $C_1$ to $C_6$ haloalkyl, $C_1$ to $C_6$ phenyl, and $C_1$ to $C_6$ alkoxyl, and in which a second carbon atom includes a second and third bond. The second and third bonds are selected, independent of each other, from the group consisting of H, $C_1$ to $C_6$ alkyl, $C_1$ to $C_6$ phenyl, and $C_1$ to $C_6$ alkoxyl. In this manner, a stable precursor capable of high Cu deposition rates is formed.

Preferably, the first bond is $H_3C$, the second bond is H, and the third bond is H, whereby an α-methylstyrene ligand is formed. To further enhance the liquid phase stability of the precursor the compound includes an additive to create a precursor blend. The precursor blend further comprises:

less than approximately 10% substituted phenylethylene, as measured by weight ratio of the precursor compound, to facilitate a stable liquid phase precursor. The same substituted phenylethylene ligand, used to form the precursor compound, is used as the additive.

A method for synthesizing a copper(hfac) substituted phenylethylene precursor is also provided. The method comprises the steps of:

a) forming a uniformly mixed solution of $Cu_2O$ in a solvent;

b) introducing a substituted phenylethylene, preferably α-methylstyrene, to the solution of Step a), and forming a uniformly mixed solution;

c) introducing hexafluoroacetylacetone (hfac) to the solution of Step b), and forming a uniformly mixed solution;

d) filtering the solution to remove solid materials, whereby any excess $Cu_2O$ is removed;

e) removing the solvent from the solution;

f) stirring until any crystallized precursor in the solution is dissolved;

g) letting the solution stand until solid material precipitates; and h) filtering to remove the solid material, whereby a liquid phase precursor is formed.

Specifically, Step a) includes the $Cu_2O$ being, in proportion, 0.210 mol, Step b) includes the substituted phenylethylene being, in proportion, 0.292 mol, and Step c) includes the hfac being, in proportion, 0.292 mol.

To insure improved liquid phase stability, the method comprises a further step, following Step h), of:

i) adding less than approximately 10%, by weight ratio, of the substituted phenylethylene used in Step b) to the solution. Preferably, Step i) includes adding approximately 5% substituted phenylethylene.

A second, preferred synthesis method, specific to the synthesis of an α-methylstyrene ligand precursor, is provided comprising the steps of:

a) forming a uniformly mixed solution of $Cu_2O$ and solvent;

b) introducing α-methylstyrene to the solution of Step a), and forming a uniformly mixed solution;

c) introducing hexafluoroacetylacetone to the solution of Step b), and forming a uniformly mixed solution;

d) filtering the solution to remove solid material in the solution, whereby excess $Cu_2O$ is removed;

e) stripping the solution of solvent; and f) filtering the solution to remove solid material and crystallized compounds, whereby a liquid phase stable precursor is formed.

Specifically, Step a) includes $Cu_2O$ being proportionally 0.91 mol, Step b) includes α-methylstyrene being proportionally 0.142 mol, and Step c) includes the hfac being proportionally 0.136 mol.

BRIEF DESCRIPTION OF THE DRAWINGS

FIG. 5 is a flowchart illustrating a preferred method for synthesizing a copper(hfac) α-methylstyrene precursor.

DETAILED DESCRIPTION OF THE PREFERRED EMBODIMENT

The substituted phenylethylene ligand copper precursor, disclosed below, is inexpensive to synthesize. Compared to trimethylvinylsilane, which costs approximately $165 per 100 g, α-methylstyrene is inexpensive, at approximately $0.60 per 100 g. The precursor is stable at room temperature for easy storage and handling. Despite retaining its liquid phase at room temperature, it is highly volatile at higher temperatures. Therefore, no decomposition occurs in the CVD liquid delivery line and vaporizer, which requires precursor stability at 90 degrees C., under vacuum, for four minutes. Further, the precursor has excellent adhesion to metal and metal nitride substrates, such as W, Ti, TiN, Ta, TaN, Al, Pt, WN, and similar barrier materials. The copper deposited with precursor has low resistivity ($<1.9 \mu\Omega \cdot cm$), high electromigration resistance, and excellent conformality to severe surface morphology.

Figure 1:
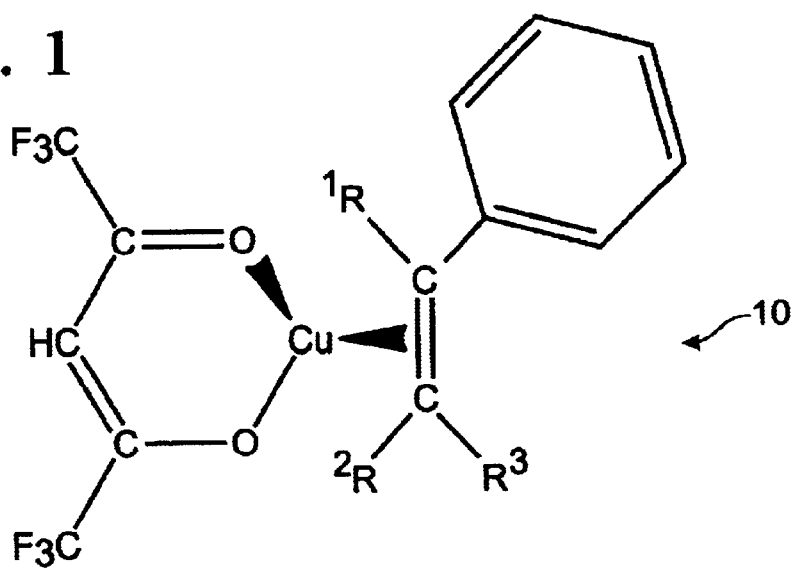
FIG. 1 is a schematic representation of the present invention precursor with a substituted phenylethylene ligand.

FIG. 1 is a schematic representation of the present invention precursor with a substituted phenylethylene ligand. Volatile copper (Cu) precursor compound 10 is used for the chemical vapor deposition (CVD) of copper (Cu) to selected surfaces. Precursor compound 10 comprises $Cu^{+1}$ (hexafluoroacetylacetonate) and a substituted phenylethylene ligand.

Figure 2:
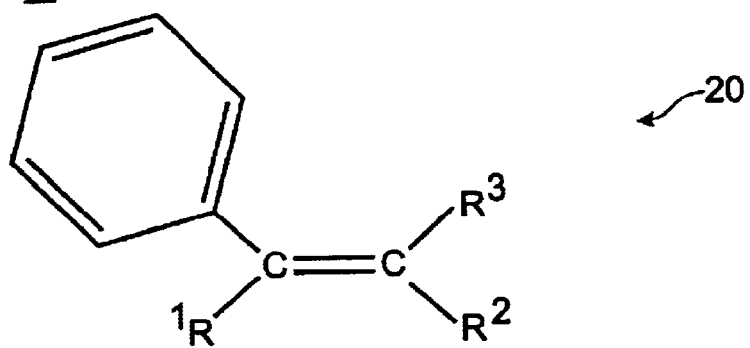
FIG. 2 is a schematic representation of a substituted phenylethylene ligand.

FIG. 2 is a schematic representation of substituted phenylethylene ligand 20. Substituted phenylethylene ligand 20 includes one phenyl group bonded to a first carbon atom, with the remaining bond to the first carbon atom being selected from a first group of potential molecules represented by $R^1$. The $R^1$ group consists of $C_1$ to $C_6$ alkyl, $C_1$ to $C_6$ haloalkyl, $C_1$ to $C_6$ phenyl, and $C_1$ to $C_6$ alkoxyl. The second carbon atom includes a second and third bond selected, respectively, from a second and third group of molecules represented by $R^2$ and $R^3$. The second and third bonds, $R^2$ and $R^3$, are selected from the group consisting of H, $C_1$ to $C_6$ alkyl, $C_1$ to $C_6$ phenyl, and $C_1$ to $C_6$ alkoxyl. The second and third bonds ($R^2$ and $R^3$) vary independently from each other. In this manner, a stable precursor capable of high Cu deposition rates is formed.

Figure 3:
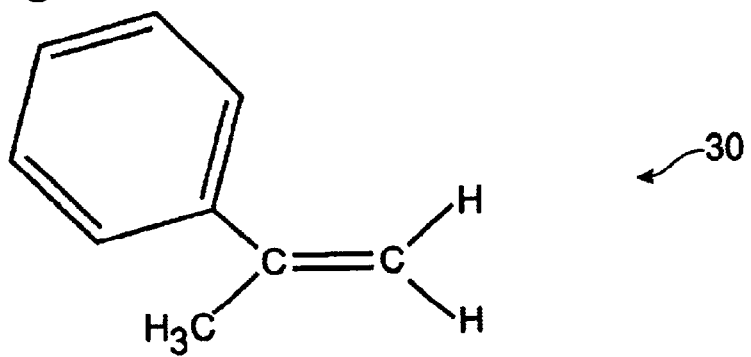
FIG. 3 is a schematic representation of the preferred embodiment α-methylstyrene ligand.

FIG. 3 is a schematic representation of the preferred embodiment α-methylstyrene ligand 30. First bond ($R^1$) is $H_3C$, the second bond ($R^2$) is H, and the third bond ($R^3$) is H, whereby an α-methylstyrene ligand is formed.

To improve and facilitate a stable liquid phase precursor, in some aspects of the invention, compound 10 includes an additive to create a precursor blend. The precursor blend further comprises:

less than approximately 10% substituted phenylethylene 20 (see FIG. 2), as measured by weight ratio of the precursor compound.

Volatile copper (Cu) precursor compound 10 is alternately represented with the following structural formula:

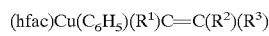

in which $R^1$ is selected from the group consisting of $C_1$ to $C_6$ alkyl, $C_1$ to $C_6$ haloalkyl, $C_1$ to $C_6$ phenyl, and $C_1$ to $C_6$ alkoxyl;

in which $R^2$ is selected from the group consisting of H, $C_1$ to $C_6$ alkyl, $C_1$ to $C_6$ phenyl, and $C_1$ to $C_6$ alkoxyl; and in which $R^3$ is selected from the group consisting of H, $C_1$ to $C_6$ alkyl, $C_1$ to $C_6$ phenyl, and $C_1$ to $C_6$ alkoxyl, whereby a precursor is formed from a substituted phenylethylene ligand.

Preferably, $R^1$ is $H_3C$, in which $R^2$ is H, and $R^3$ is H, whereby an α-methylstyrene ligand is formed.

In some aspects of the invention, the compound includes an additive to create a Cu precursor blend, the blend further comprising the substituted phenylethylene has the following structural formula:

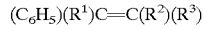

in which $R^1$ is selected from the group consisting of $C_1$ to $C_6$ alkyl, $C_1$ to $C_6$ haloalkyl, $C_1$ to $C_6$ phenyl, and $C_1$ to $C_6$ alkoxyl;

in which $R^2$ is selected from the group consisting of H, $C_1$ to $C_6$ alkyl $C_1$ to $C_6$ phenyl, and $C_1$ to $C_6$ alkoxyl; and in which $R^3$ is selected from the group consisting of H, $C_1$ to $C_6$ alkyl, $C_1$ to $C_6$ phenyl, and $C_1$ to $C_6$ alkoxyl, whereby the precursor is further stabilized in a liquid phase.

Typically, the additive is less than approximately 10% by weight ratio of the precursor blend. The substituted phenylethylene ligand selected to form the precursor is the same substituted phenylethylene ligand used as the additive to form the precursor blend. That is, when the precursor uses an α-methylstyrene ligand, the additive is also an α-methylstyrene.

The above-described copper precursor is synthesized by two different methods. The prior art (Doyle) synthesis procedures proved unsatisfactory. The reaction between $Cu_2O$, 1,1,1,5,5,5-hexafluoroacetylacetone and α-methylstyrene, in making α-methylstyrene copper(I) hexafluoroacetylacetonate ((α-MS)Cu(hfac)) in dichloromethane, produces a half-liquid, half-crystalline solid. The solid portion is unsuitable for delivery in a vaporization process and must be removed. Further, in the separated liquid portion, small crystals are continually precipitated at room temperature over time. To remedy this situation, the published synthesis route was modified to create two new synthesis methods.

First, the product synthesized from the published method was strongly stirred for ten hours at room temperature until all of the small crystals disappeared, then the liquid product was let to stand for twelve hours. During this period, large crystals were formed. The liquid portion was separated from the large crystals by filtration (1 μm pore size). Then, 5% (w/w) α-methylstyrene was added into the liquid as a stabilizer. By using this method, a very phase stable copper liquid precursor was obtained, but the yield was not high, at about 40%. After standing for a month, no crystal precipitate was observed in the stabilized liquid source.

Figure 4:
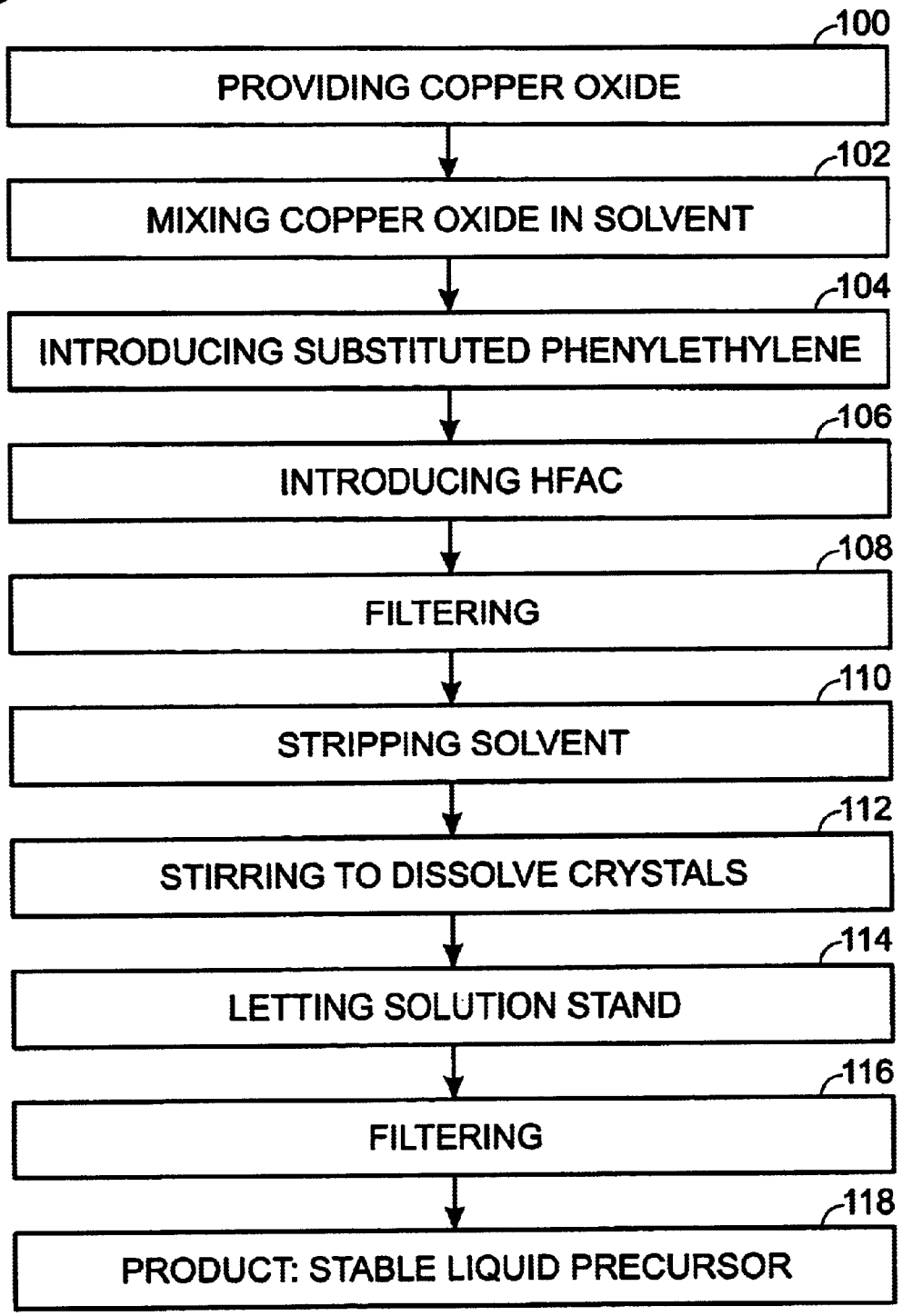
FIG. 4 is a flowchart illustrating steps in a method for synthesizing a copper(hfac) substituted phenylethylene precursor.

FIG. 4 is a flowchart illustrating steps in a method for synthesizing a copper(hfac) substituted phenylethylene precursor. Step 100 provides $Cu_2O$. Step 102 forms a uniformly mixed solution of $Cu_2O$ in a solvent. Step 102 includes using a solvent selected from the group consisting of dichloromethane and tetrahydrofuran (THF), although dichloromethane is preferred. Step 104 introduces a substituted phenylethylene to the solution of Step 102, and forms a uniformly mixed solution. In the preferred embodiment, Step 104 includes the substituted phenylethylene being α-methylstyrene. Step 106 introduces hexafluoroacetylacetone (hfac) to the solution of Step 104, and forms a uniformly mixed solution.

Step 108 filters the solution to remove solid materials, whereby any excess $Cu_2O$ is removed. It is typical to add excess $Cu_2O$ to the procedure. $Cu_2O$ is inexpensive and an excess amount produces a higher yield of precursor. At this step in the process other solids such as impurities are removed. In some aspects of the invention celite ($SiO_2$) is used to filter the solution. Often celite is used in addition to a ceramic filter having pore diameters in the range between 10 and 25 microns. Therefore, Step 108 includes removing solid material larger than approximately 10 microns.

Step 110 removes the solvent from the solution. Step 112 stirs the remaining solution until any crystallized precursor in the solution is dissolved. Even in relatively small batches this stirring may take ten hours to accomplish. Step 114 lets the solution stand until crystals form. In some aspects of the invention, Step 114 includes letting the solution stand until crystals having a size in the range from 2 to 4 millimeters are formed. This step takes approximately twelve hours in some aspects of the invention. Step 116 filters to remove the solid material. Step 116 includes filtering solid material having a size greater than approximately 1 micron. In small batches, a 1 micron size filter on a syringe opening, was used to extract the solution. Step 118 is a product, a liquid phase precursor.

In some aspects of the invention, Step a) includes the $Cu_2O$ being, in proportion, 0.210 mol, Step b) includes the substituted phenylethylene being, in proportion, 0.292 mol, and Step c) includes the hfac being, in proportion, 0.292 mol. By maintaining the above-described proportions, precursor is made in batches of any size.

In some aspects of the invention, a further step follows Step 116. Step 116a (not shown) adds less than approximately 10%, by weight ratio, of the substituted phenylethylene used in Step 104 to the solution, whereby the liquid phase stability of the precursor is improved. Preferably, Step 116a includes adding approximately 5% substituted phenylethylene.

To improve the yield, a second synthesis method was developed, in which extra α-methylstyrene was introduced into reaction. In this way, the yield has been increased to about 87%.

All manipulations were carried out in an air-free dry glovebox or by using standard Schlenk techniques. Solvents were purified before synthesis. Dichloromethane and α-methylstyrene were refluxed and distilled over calcium hydride under an atmosphere of nitrogen prior to use. 1,1,1,5,5,5-hexafluoroacetylacetone was purchased from Strem respectively, and used directly without any purification.

The synthesis procedure of organometallic copper(I) complexes was first described by Doyle in U.S. Pat. No. 4,385,005, in which copper monoxide reacted with unsaturated organic hydrocarbon and 1,1,1,5,5,5-hexafluoroacetylacetone in dichloromethane or THF. The reaction is described by the following equation:

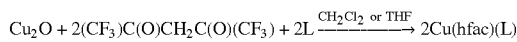

$$Cu_2O + 2(CF_3)C(O)CH_2C(O)(CF_3) + 2L \xrightarrow{CH_2Cl_2 \text{ or THF}} 2Cu(hfac)(L)$$

where L is unsaturated organic hydrocarbon ligand.

According to the synthesis procedure above, the synthesis of (α-MS)Cu(hfac) gives the product containing both liquid and crystalline solid phases. By filtration, the liquid portion was easily separated from the solid. After twelve hours, some small crystals precipitated from the liquid. The NMR studies indicated the liquid part of the compound being Cu(hfac)(α-MS), which is expected, whereas the solid is an unknown compound, which is still under investigation. To improve the yield of liquid compound, Doyle's synthesis procedure was modified by introducing 5 to 10% extra α-methylstyrene (α-MS) into reaction. By this modified synthesis procedure, pure liquid Cu(hfac)(α-MS) is obtained with a high yield.

In the synthesis of Cu(hfac)(α-MS), $Cu_2O$ (13.0 g, 0.091 mol) was added into a 100 ml round bottom flask equipped with $CH_2Cl_2$ (50 ml) and a stirring bar. To this $Cu_2O$ dichloromethane solution, α-methylstyrene (18.5 ml, 0.142 mol) was added and stirred at room temperature for ten minutes. Then 1,1,1,5,5,5-hexafluoroacetylacetone (19.2 ml, 0.136 mol) was slowly introduced into this red color solution with stirring. After 5 minutes, the solution color gradually changed to green. The green solution was continually stirred for another 10 minutes, and then filtered through celite. The green filtrate was stripped under vacuum for four hours and then heated to 35° C. under vacuum for another half-hour stripping. This produced a green liquid organometallic copper compound, which was then filtered through a fine filter (1 μm) to give 49.19 grams of product (yield: 87.38%).

The calculation of yield was carried out as follows. Because of the high boiling point of α-methylstyrene, it was assumed that no α-methylstyrene was lost. Then, X is set to be the weight of free α-methylstyrene in product, Y, the weight of Cu(hfac)(α-MS), and A, the total weight of product. The following equations result:

$$X+Y=A$$

$$Y=(388.73)/118.18)\times(18.5\times0.909-X)$$

where the molecular weight of Cu(hfac)(α-MS) and α-methylstyrene are 388.73 and 118.18 respectively, and the density of α-methylstyrene is 0.909 g/ml. Thus, we have
Y=1.4368(A−18.5×0.909) (when A=49.19, then Y=46.511) and yield=(Y/53.23)·100%=87.38%.

The primary investigation on the properties of Cu(hfac)(α-MS) has been summarized as follows:
1) density is about 1.3 g/ml;
2) with the addition of 5% extra α-methylstyrene as stabilizer, Cu(hfac)(α-MS) is stable at room temperature without any crystal or solid precipitation, at 75 degrees C. under vacuum (0.02 mmHg), the compound is stable for three hours and then very slowly starts decomposition with the precipitation of copper metal, and at 100 degrees C. under vacuum (0.02 mmHg), decomposition starts slowly after five minutes; and
3) Cu(hfac)(α-MS) dissolves in hexane very sparsely, and in benzene, the compound dissolves very well, but slowly decomposes with the precipitation of copper after several days.

The NMR structural analysis was carried out on a QE 300 MHz NMR instrument. The results are as follows: $^1$H NMR $(C_6D_6)$ δ1.67 (s, 3, $(C_6H_5)(CH_3)C=CH_2$), 3.68 (s, 1, $(C_6H_5)(CH_3)C=CH_2$), 4.26 (s, 1, $(C_6H_5)(CH_3)C=CH_2$), 5.97 (s, 1, $(CF_3)C(O)CHC(O)(CF_3)$), 7.00 (multi. $(C_6H_5)(CH_3)C=CH_2$), 7.24 (multi. $(C_6H_5)(CH_3)C=CH_2$)

FIG. 5 is a flowchart illustrating a preferred method for synthesizing a copper(hfac)α-methylstyrene precursor. Step 150 provides $Cu_2O$. Step 152 forms a uniformly mixed solution of $Cu_2O$ and solvent. Step 152 includes using a solvent selected from the group consisting of dichloromethane and tetrahydrofuran (THF). Step 154 introduces α-methylstyrene to the solution of Step 152, and forms a uniformly mixed solution. Step 156 introduces hexafluoroacetylacetone to the solution of Step 154, and forms a uniformly mixed solution. Step 158 filters the solution to remove solid material in the solution, whereby excess $Cu_2O$ is removed. Step 158 includes filtering solids having a size greater than approximately 10 microns. Typically, Step 158 includes using celite to perform the solution filtering. Step 160 strips the solution of solvent. Step 162 filters the solution to remove solid material and crystallized compounds. Step 162 includes removing solid material and crystallized compounds having a size larger than approximately 1 micron. Step 164 is a product, where a liquid phase stable precursor is formed.

Specifically, Step 152 includes $Cu_2O$, in proportion, of 0.91 mol, Step 154 includes α-methylstyrene, in proportion, of 0.142 mol, and Step 156 includes the hfac, in proportion, of 0.136 mol.

In some aspects of the invention, a further step, follows Step 158, and precedes Step 162. Step 160a heats the solution to approximately 35 degrees C. to aid in the stripping of solvent from the solution.

A new and improved copper precursor, and synthesis method for the copper precursor, has been disclosed above. The precursor, especially the α-methylstyrene ligand precursor, is stable a low temperatures, and sufficiently volatile at higher temperatures. Copper deposited with the precursor has low resistivity and high adhesive characteristics. Finally, the precursor is inexpensive to make. A synthesis method has been disclosed which produces a high yield of the above-described precursor. Other variations and embodiments will occur to those skilled in the art.

What is claimed is:

1. A method for synthesizing a cooper(hfac) substituted phenylethylene precursor comprising the steps of:
 a) forming a uniformly mixed solution of $Cu_2O$ in a solvent;
 b) introducing a substituted phenylethylene to the solution of Step a), and forming a uniformly mixed solution;
 c) introducing hexafluoroacetylacetone (hfac) to the solution of Step b), and forming a uniformly mixed solution;
 d) filtering the solution to remove solid materials, where any excess $Cu_2O$ is removed;
 e) removing the solvent from the solution;
 f) stirring until any crystallized precursor in the solution is dissolved;
 g) letting the solution stand until crystals form;
 h) filtering to remove the solid material, whereby a liquid phase precursor is formed; and
 i) adding less than approximately 10% by weight ratio, of the substituted phenylethylene used in Step b) to the solution, whereby the liquid phase stability of the precursor is improved.

2. A method as in claim 1 in which Step i) includes adding approximately 5% substituted phenylethylene.

* * * * *